United States Patent [19]

Moyer

[11] Patent Number: 4,612,564
[45] Date of Patent: Sep. 16, 1986

[54] PLASTIC INTEGRATED CIRCUIT PACKAGE

[75] Inventor: Harold W. Moyer, Allentown, Pa.

[73] Assignee: AT&T Bell Laboratories, Murray Hill, N.J.

[21] Appl. No.: 616,823

[22] Filed: Jun. 4, 1984

[51] Int. Cl.[4] ............... H01L 23/40; H01L 23/12
[52] U.S. Cl. ................................ 357/70; 357/68
[58] Field of Search ............ 357/70, 68, 65, 80; 174/52 FP

[56] References Cited

U.S. PATENT DOCUMENTS 4,417,266 11/1983 Grabbe ........................... 357/68

FOREIGN PATENT DOCUMENTS 0140465 10/1979 Japan .............................. 357/70
0027353 2/1983 Japan .............................. 357/70

Primary Examiner—Andrew J. James
Assistant Examiner—S. V. Clark
Attorney, Agent, or Firm—Lester H. Birnbaum; Peter V. D. Wilde

[57] ABSTRACT

The specification describes an integrated circuit package with a lead frame that incorporates crossunder members for power distribution. It uses a paddle member for chip support and back plane contact, with crossunders extending alongside the paddle. Insulating means is interposed between the chip and the lead frame with an opening to allow contact from the chip to the paddle.

8 Claims, 3 Drawing Figures

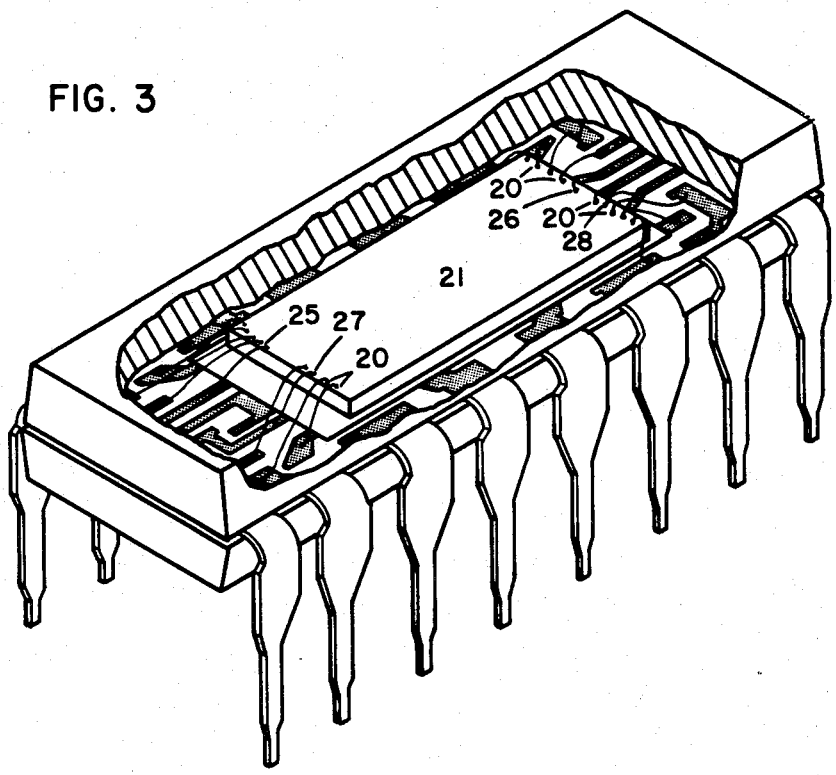

PLASTIC INTEGRATED CIRCUIT PACKAGE

BACKGROUND OF THE INVENTION

Integrated circuit chips have grown in size and packing density to meet user demand for more functions and storage capacity at lower cost. With this development, advantages in distributing power to the chip become important.

A common approach is to incorporate a power distribution network into the chip itself. However, the power busses tend to be large and the chip size must be increased, or functional space sacrificed, to accommodate them. Aside from the usual cost disadvantages, an increase in the size of a chip that is already comparatively large may require an expensive, or non-standard, packaged design. Correct use of these tradeoffs is becoming an important ingredient in the ability of a manufacturer to produce cost competitive integrated circuit devices.

An alternative to increasing the chip size to accommodate the power distribution network is to distribute the power off chip and introduce power (and ground) at more than one bonding site on the chip. However, each new bonding site consumes a pin and it is desirable to avoid multiple pins for power as well as to avoid separate power distribution means on the mounting board.

STATEMENT OF THE INVENTION

I have discovered a way to distribute power off chip without using additional pins by incorporating the power distribution network in a specially designed lead frame. The approach is similar to one described and claimed in application Ser. No. 544,420, filed Oct. 21, 1983 but has important differences. The lead frame described in that application eliminates the support paddle and backplane contact completely and substitutes crossunder members for the paddle. The backplane contact is provided by a conductive foil layer that is separate from the lead frame. While the prior structure has proven extremely effective, occasions may arise in which a paddle support member may be desired and where a combined paddle-backplane contact is desired. I have designed a package that combines the desirable features of various prior package designs. It employs an elongated paddle member that extends the length (or width) of the chip but is narrower than the width of the chip. On one (or both) sides of the paddle are crossunders for power and ground (or for other desired electrical functions). An insulating interlayer is provided to electrically insulate the chip backside from the crossunders. That layer does not completely cover the paddle allowing contact regions or contact members to extend from said paddle into contact with the backside of the chip.

BRIEF DESCRIPTION OF THE DRAWING

FIG. 3 is a view similar to FIG. 2 showing a chip installed in the package.

DETAILED DESCRIPTION

Figure 1:
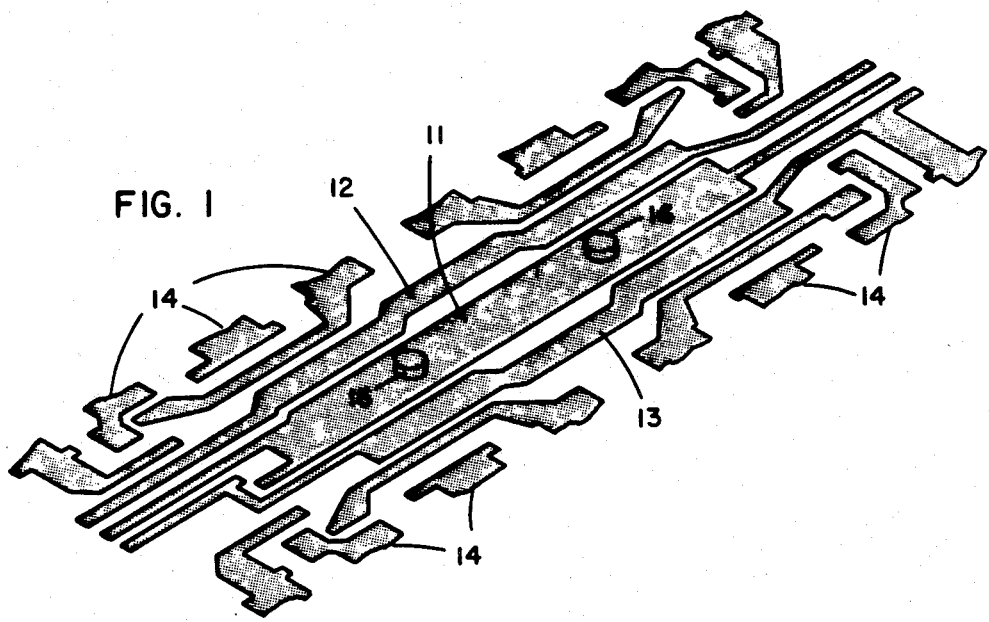
FIG. 1 is a perspective view of a lead frame designed in accordance with one aspect of the invention.

A lead frame designed in accordance with the invention is shown in FIG. 1. The lead frame is standard except for the interior portion, often referred to as the paddle portion.

Figure 2:
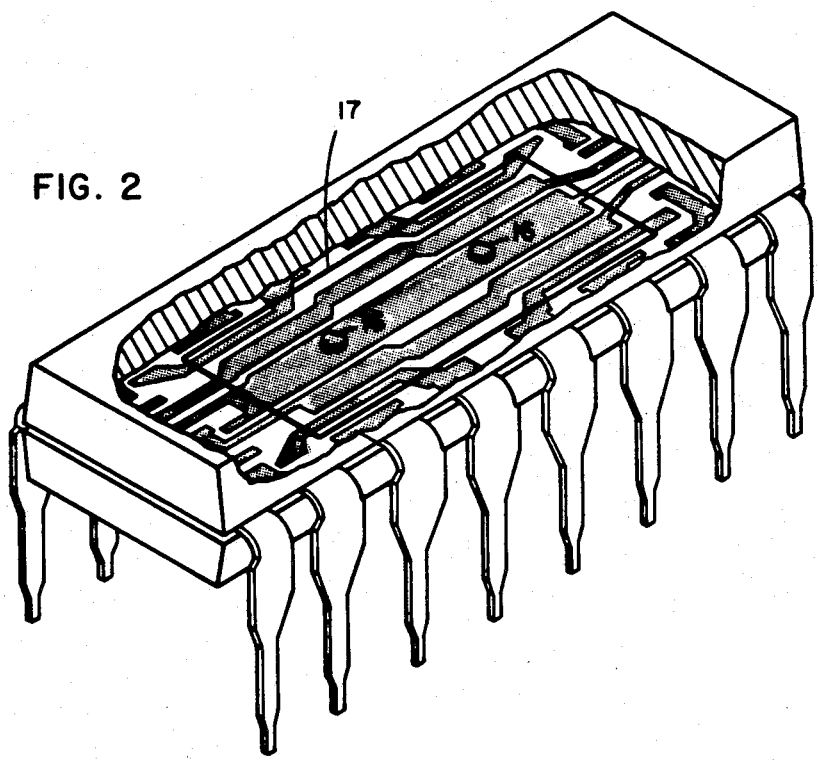
FIG. 2 is a perspective view, partly cut away, of the lead frame encapsulated in a plastic package.

The elongated section 11 extends the length of the chip that will later be attached to the lead frame, and serves both as the chip support and the contact to the back of the chip. Alongside the paddle member are crossunder members 12 and 13 which also extend the length of the chip, plus an additional length sufficient to provide wire bonding sites as will later be shown. The remainder of the lead frame is conventional with a plurality of bonding sites 14 shown arranged around the periphery of the central paddle and crossunder region. It will be understood by those skilled in the art that the frame shown is typically part of an endless tape with repeating lead frame units onto which chips are attached in assembly line fashion. Affixed to, or integral with, the central paddle member 11 are contact pins 16. The lead frame of FIG. 1 is shown in FIG. 2 installed in a conventional plastic packaging material but with the chip removed to show the lead frame detail. Covering the crossunder members 12 and 13 is an insulating film 17 made for example, from mylar or the like. Openings in the film 17 are provided for the protruding pins 16. When the chip is installed over the central portion of the lead frame the back of the chip will be insulted from the crossunder members 12 and 13, but will electrically contact the paddle member 11 via pins 16. Provision is made at one, or both, ends of the paddle 11 to accommodate a backplane wire contact. Alternatively, paddle 11 may communicate electrically with an external lead. The means for establishing electrical contact between the back of the chip and the paddle member 11 may assume a variety of forms. The pin arrangement of FIG. 1 is but one choice. The contact means may be, for example, simply an opening in the insulating film to allow the chip to be soldered or conductively bonded directly to the member 11. The pin arrangement shown was selected because film 17 has a finite thickness, and the height of the pin is selected to extend through that film facilitating reliable contact to the chip backside. The height of the pins 16 shown in FIG. 1 can be made to be of the order of thickness of the material from which the lead frame is made so the pins can conveniently be formed by die stamping.

The completed package is shown in FIG. 3 with a portion cut away, as in FIG. 2, to show the manner in which the chip is installed in the package. Here wire bonds 20 are shown extending from the various bonding sites on the lead frame (FIG. 1) to bonding sites on the chip 21. Bonds to crossunder 12 are shown at 25 and 26, and bonds to crossunder 13 are shown at 27 and 28.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. Device comprising;
    a lead frame including a plurality of metal bonding sites formed in a configuration having an interior portion and a plurality of electrical conductor members extending outwardly from said plurality of bonding sites,
    a central chip support region in the interior portion of the bonding site configuration, said chip support region comprising:
    a chip support paddle, at least one conductive crossunder member having two ends and extending alongside the chip support paddle, a semiconductor chip having at least two opposing edges, said chip electrically contacting said chip support paddle and overlying substantially the said crossunder member so that said crossunder member extends from at least one edge of the chip to the other edge of the chip, insulating means between the chip and crossunder members, and at least one conductive wire bond extending from said chip to said crossunder member.

2. Device of claim 1 including wire bonds connecting the chip with each end of the crossunder member.

3. Device of claim 2 having at least two crossunder members.

4. Device of claim 1 in which the semiconductor chip contacts the chip support paddle by means of pins extending from said paddle into contaact with said chip.

5. Device of claim 1 in which the insulating means is a film of dielectric material with openings in the film through which the chip contacts the said paddle.

6. Device of claim 5 in which said film of dielectric material is a plastic film.

7. Device of claim 5 in which the chip contacts the paddle via pins integral with the paddle said pins extending through said openings.

8. Device of claim 7 in which the openings are approximately the size of the pins.

* * * * *